United States Patent [19]

Kaneda et al.

[11] Patent Number: 4,701,773
[45] Date of Patent: Oct. 20, 1987

[54] SEMICONDUCTOR DEVICE FOR RECEIVING LIGHT

[75] Inventors: Takao Kaneda; Kazuo Nakajima, both of Kawasaki, Japan

[73] Assignee: Fujitsu Limited, Kawasaki, Japan

[21] Appl. No.: 900,249

[22] Filed: Aug. 25, 1986

Related U.S. Application Data

[63] Continuation of Ser. No. 821,884, Jan. 27, 1986, abandoned, which is a continuation of Ser. No. 549,430, Nov. 7, 1983, abandoned.

[30] Foreign Application Priority Data

Nov. 8, 1982 [JP] Japan .................. 57-195519

[51] Int. Cl.$^4$ .......................................... H01L 29/90
[52] U.S. Cl. ........................................ 357/13; 357/30
[58] Field of Search .................................. 357/13, 30

[56] References Cited

U.S. PATENT DOCUMENTS

| | | | |
|---|---|---|---|
| 4,254,429 | 3/1981 | Yamazaki | 357/16 |
| 4,353,081 | 10/1982 | Allyn et al. | 357/16 |
| 4,383,269 | 5/1983 | Capasso | 357/30 |
| 4,390,889 | 6/1983 | Capasso et al. | 357/13 |
| 4,442,444 | 4/1984 | Osaka | 357/13 |
| 4,473,835 | 9/1984 | Forrest et al. | 357/13 |
| 4,476,477 | 10/1984 | Capasso et al. | 357/30 |
| 4,481,523 | 11/1984 | Osaka et al. | 357/13 |
| 4,486,765 | 12/1984 | Capasso | 357/13 |

FOREIGN PATENT DOCUMENTS 0023723 8/1980 European Pat. Off. .

OTHER PUBLICATIONS

8179 IEEE Electron Devices Letters, "The Graded Bandgap Multilayer Avalanche Photodiode: A New Low-Noise Detector", Williams et al., vol. EDL-3, Mar. 3, 1982, pp. 71-73.

320 Applied Physics Letters, "Enhancement of Electron Impact Ionization in a Superlattice: A New Avalanche Photodiode with a Large Ionization Rate Ratio", Capasso et al., vol. 40, No. 1, Jan. 1982, pp. 38-40.

*Primary Examiner*—Robert E. Wise
*Attorney, Agent, or Firm*—Staas & Halsey

[57] ABSTRACT

A semiconductor device for receiving light includes a first semiconductor layer having a first conductivity type; the device further includes a second semiconductor layer having the first conductivity type, contacting the first semiconductor layer, having a forbidden bandwidth larger than that of the first semiconductor layer and distributed so that the forbidden bandwidth has a maximum value at an intermediate position in the vertical direction and of the second semiconductor layer. The semiconductor device further includes a third semiconductor region having a second conductivity type opposite the first conductivity type, contacting the second semiconductor layer and having a forbidden bandwidth smaller than that of the third contact end portion between the semiconductor region and the second semiconductor layer and larger than that of the first semiconductor layer. The third semiconductor region having the second conductivity type acts as a window layer through which incident light is transmitted.

6 Claims, 4 Drawing Figures

SEMICONDUCTOR DEVICE FOR RECEIVING LIGHT

This is a continuation of co-pending application Ser. No. 821,884 filed on Jan. 27, 1986, which is a continuation of U.S. application Ser. No. 549,430, filed Nov. 7, 1983, both now abandoned.

BACKGROUND OF THE INVENTION (1) Field of the Invention

The present invention relates to a semiconductor device for receiving light.

(2) Description of the Prior Art

In recent years, increasing use has been made of optical communications and the like wherein light is used as a medium for information. Semiconductor devices for converting light signals into electrical signals are important fundamental elements in these fields. Many such semiconductor devices have already been developed and put into practical use.

One of these semiconductor devices is the avalanche photodiode (APD) in which a photocurrent is multiplied by an avalanche process, thereby increasing the sensitivity of the device. APD's are very effective for improving the signal-to-noise (S/N) ratio of light detectors.

APD's used as semiconductor devices for receiving light should have superior characteristics in the wavelength band of 1 $\mu$m, especially in the wavelength band extending from 1.3 $\mu$m to 1.6 $\mu$m.

The reason for this is that the material dispersion of quartz type optical fibers used in optical communications is extremely small near a wavelength of 1.3 $\mu$m. As a result, the mode dispersion, which is the sum of the material dispersion and waveguide dispersion, is small in the wavelength range of 1.3 to 1.5 $\mu$m.

Many proposals have been made for use with APD's for bands of wavelength 1 $\mu$m or greater, using germanium or III-V compound semiconductors. Already developed, for example, is an APD using indium-gallium-arsenic (InGaAs) as the optical absorption layer. In such an APD, application of a reverse bias voltage results in the formation of a depletion layer near the p-n junction. In this depletion layer, input signal light excites electrons in the conduction band, resulting in electron-hole pairs. Avalanche multiplication takes place with the holes as the primary carriers. In such an APD, during the process of avalanche multiplication, there is a statistical flicker in the number of collisions between the carriers and the atoms constructing the crystal lattice. This gives rise to a unique, undesirable phenomenon referred to as "multiplication noise".

In the process of avalanche multiplication, when the ionization coefficient ratio k is approximately 1, k being defined as the ratio of the number of times the holes produce collision ionization per unit length, i.e., the ionization coefficient of the holes $\beta$ over the ionization coefficient of the electrons $\beta$, that is, k$\approx$1, all secondary carriers produce collision ionizations. Therefore, a high current multiplication rate can be obtained even with a low number of collision ionization phenomena. However, the statistical flicker in the number of collisions results in a large multiplication noise.

On the other hand, if k<<1, multiplication is not generated by the holes. Only the electrons produce collision ionizations. Therefore, the statistical flicker of the number of collisions is not so important, and the multiplication noise is small. The situation is also the same when the ionization coefficient $\beta$ of the holes is much larger than the ionization coefficient $\alpha$ of the electrons, that is, $k^{-1}<<1$.

The ionization coefficients $\alpha$ and $\beta$ increase naturally with the increase in the intensity of the electric field. In this case, however, the ionization coefficient ratio k or $k^{-1}$ approaches 1, whereupon multiplication noise increases.

Therefore, in order to reduce the multiplication noise of an APD, the difference between the ionization coefficient of the electrons and that of the holes must be made as large as possible.

To achieve this, in the prior art, the semiconductor materials are carefully selected and the electric field intensity is optimized for generating avalanche breakdown.

It has been reported that the ionization coefficient ratio between the electrons and the holes can be enlarged by giving an "incline" to the energy band, for example, the "forbidden bandwidth" of the semiconductor becomes smaller in direction of the travel of the electrons. Here, however, the premise is that the generation of the primary electron carriers, that is, the optical absorption, is obtained in the semiconductor layer where the forbidden bandwidth is largest. If applied directly to an APD for a wavelength band of 1 $\mu$m or more, a semiconductor material with a very small forbidden bandwidth must be used, resulting in the problem of increased dark current.

On the other hand, with other semiconductors under study, the optical absorption is obtained in only the layer where the forbidden bandwidth is small. Effective injection of carriers with a large ionization probability, that is, electrons in the above example, is not carried out and the multiplication noise increases.

Therefore, for effective use of the construction of enlarging the ionization coefficient ratio by giving an incline to the energy band, especially with respect to an APD for a wavelength band of 1 $\mu$m or more, carriers with a large ionization coefficient must be injected effectively in the semiconductor layer where the incline is given.

SUMMARY OF THE INVENTION

An object of the present invention is to provide an APD, especially an APD suitable for a band of 1 $\mu$m or more, by which the ionization coefficient of the carriers with a large ionization coefficient increases at a point substantially at the incline of the forbidden bandwidth, resulting in reduced multiplication noise.

The above-mentioned object can be achieved by a semiconductor device for receiving light which includes a first semiconductor layer having a first conductivity type and a second semiconductor layer contacting the first semiconductor layer and having a forbidden bandwidth larger than that of the first semiconductor layer and distributed so that the the forbidden bandwidth is a maximum at the intermediate position of the thickness direction and having the first conductivity type. The semiconductor device further includes a third semiconductor region having a second conductivity type opposite the first conductivity type, contacting the second semiconductor layer and having a forbidden bandwith smaller than that of the contact end portion between the third semiconductor region and the second semiconductor layer and larger than that of the first semiconductor layer. The third semiconductor region with a second conductivity type acting as a window layer through which incident light is received.

BRIEF DESCRIPTION OF THE DRAWINGS

Further features and advantages of the present invention will be apparent from the ensuing description with reference to the accompanying drawings, wherein.

DESCRIPTION OF THE PREFERRED EMBODIMENTS

Before describing the preferred embodiment, an explanation of the prior art device will be given for reference purposes.

Figure 1:
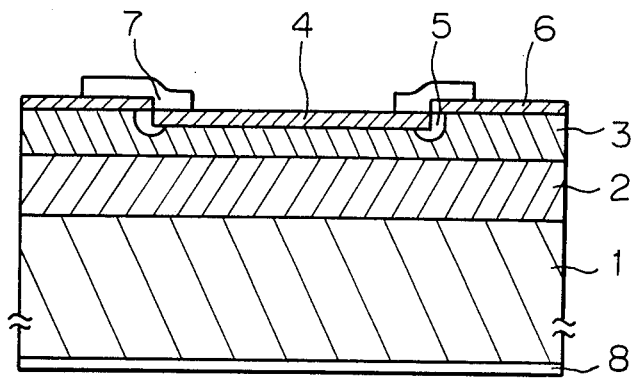
FIG. 1 is a cross-sectional view of a conventional APD.

FIG. 1 is a cross-sectional view of a prior art APD. In FIG. 1, reference numeral 1 is an n+ type InP substrate, 2 is an n type InGaAs optical absorption layer, 3 is an n type InP multiplication layer, 4 is a P+ type region formed in the InP layer, 5 is a P type region having a guard ring effect, 6 is an insulating film, 7 is a P side electrode, and 8 is an n side electrode.

By applying a reverse bias voltage to the APD using the n side electrode as the positive pole and the P side electrode as the negative pole, a depletion layer is formed near the p-n junction, that is, the boundary between the P+ type region 4 and the n type InP multiplication layer 3. The above depletion layer extends to the n type InGaAs optical absorption layer 2. In this depletion layer, the input light signal excites electrons in the conduction band. The result is that electron-hole pairs are generated. The electrons drift to the n side electrode 8, and the holes drift to the P side electrode 7. Avalanche multiplication with the holes as the primary carriers occurs in the n type InP multiplication layer 3.

Figure 2:
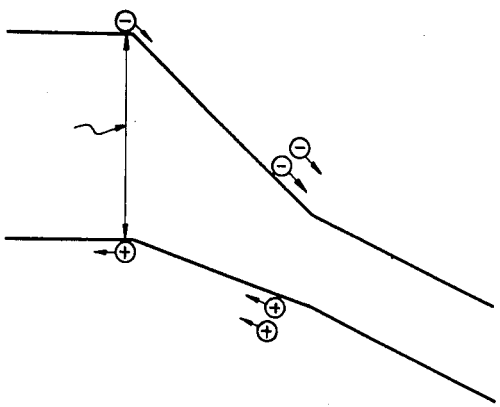
FIG. 2 is a diagram of a known method for enlarging the ionization probability ratio.

FIG. 2 is an explanatory view of the known method for enlarging the ionization coefficient ratio. As mentioned earlier, by constructing the semiconductor device so that the forbidden bandwidth is gradually reduced in the direction of travel of the electrons, the ratio of the electrons' energy to the energy of the forbidden bandwidth increases more suddenly than in the case of a constant forbidden bandwidth, resulting in an increase in the ionization coefficient $\alpha$ of the electrons.

The semiconductor device of the present invention includes a first semiconductor layer having a first conductivity type, a second semiconductor layer having the first conductivity type, contacting the first semiconductor layer, having a forbidden bandwidth larger than that of the first semiconductor layer and distributed so that the forbidden bandwidth is maximum at the intermediate position of the thickness direction and having a third semiconductor region having a second conductivity type opposite the first conductivity type, contacting the second semiconductor layer and having a forbidden bandwidth smaller than that of the contact end portion between the third semiconductor region and the second semiconductor layer and larger than that of the first semiconductor layer The third semiconductor region along with the second conductivity type acts as a window layer through which incident light is received. The second semiconductor layer may be of various constructions, i.e., one where the composition is varied continuously to make the forbidden bandwidth increase then decrease continuously, one where a plurality of layers with different compositions are laminated so that the forbidden bandwidth becomes smaller stepwise on both sides of the largest bandwidth layer, and one where both the continuous and stepwise variations are contained.

In the semiconductor device of the present invention, the first semiconductor layer is the optical absorption region. The region between the second semiconductor layer, where the forbidden bandwidth is the largest, and the p-n junction interfaces with the third semiconductor region, is the multiplication region. Of the electron-hole pairs generated in the optical absorption region, those carriers with a large ionization coefficient of avalanche breakdown are injected into the multiplication region. As the forbidden bandwidth is gradually reduced in the direction of travel of the carriers, the ionization coefficient increases.

There is a large difference between the largest forbidden bandwidth of the second semiconductor layers and the forbidden bandwidth of the first semiconductor layer, but a transition area with a gradual increasing forbidden bandwidth is formed therebetween. Therefore, carriers with a large ionization coefficient are injected at a high speed in to the multiplication region.

Figure 3:
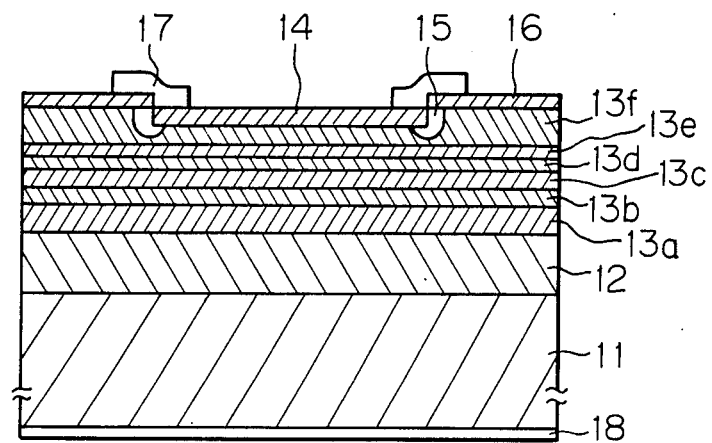
FIG. 3 is a cross-sectional view of an embodiment in accordance with the invention.
Figure 4:
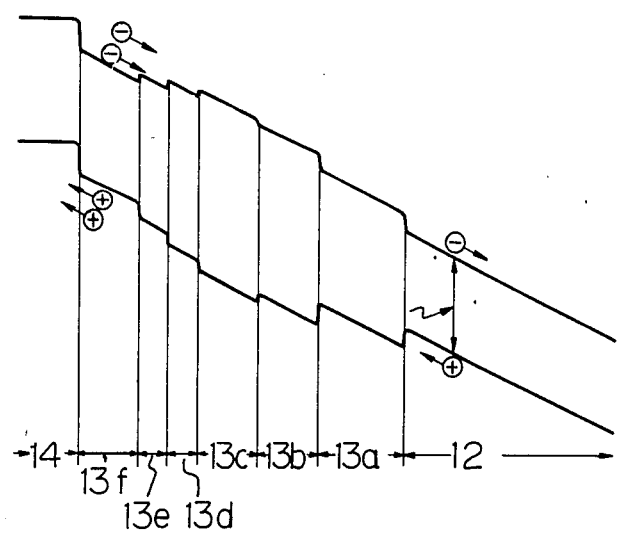
FIG. 4 is a diagram of the energy band of FIG. 3.

FIG. 3 is a cross-sectional view of a III-V group compound semiconductor APD in accordance with an embodiment of the invention. FIG. 4 is a view of the energy band when the desired voltage is applied to the APD of the embodiment of FIG. 3, in which the same reference numerals show corresponding locations of FIG. 3.

In FIG. 3, reference numeral 11 is an n+ type InP substrate, 12 is an n type InGaAs optical absorption layer, 13a to 13f are n type semiconductor layers in accordance with the invention, 14 is a P+ type semiconductor region, 15 is a P type region having a guard ring effect, 16 is an insulating membrane, 17 is a P side electrode, and 18 an n side electrode.

The semiconductor layers or regions of this embodiment have the following compositions and forbidden bandwidths.

| Reference numeral | Composition | Forbidden bandwidth [eV] |
|---|---|---|
| 12 | InGaAs | 0.75 |
| 13a | InGaAsP | 1.05 |
| 13b | InP | 1.35 |
| 13c | AlInAs | 1.45 |
| 13d | InP | 1.35 |
| 13e | InGaAsP | 1.2 |
| 13f | InGaAsP | 1.0 |
| 14 | InGaAsP | 1.0 |

The semiconductor layers shown by reference numerals 12 to 13f are successively formed on the InP substrate 11 by liquid epitaxial growth, molecular beam epitaxial growth, etc.

The formation of the AlInAs layer 13c formed by liquid epitaxial growth will be explained by way of example. An InP substrate, a "meltback solution", and a material crystal of growing solution are placed in a usual liquid epitaxial growth slide boat. The boat is placed in a quartz reaction tube in which pure hydrogen flows. In this case, the upper surface of the InP substrate is used as the (111)A crystal surface and is covered by another InP plate to protect it.

The temperature is raised to 810° C. and kept there for 30 minutes. The temperature is then allowed to drop at a rate of 0.3° C./min. The meltback of the InP substrate and the AlInAs crystal growth are effected as follows:

(1) Meltback of InP Substrate
Solution composition: In:InP=2.1844 g:0.0695 g
Temperature: B 770° C.
Time: About 10 seconds (2) AlInAs Crystal Growth
solution composition: AlIn:InAs:In=4.0082 g:1.2207 g:0.01085 g.

The AlIn is a solid solution containing 0.1 atomic%, that is, 0.0235 weight% Al in In. The reason why an AlIn mother alloy is used is that it is difficult to uniformly melt and mix Al in In by itself due to a monotectic reaction.

Atomic fraction of the solution:
$X_{Al}^1 = 0.00073$
$X_{In}^1 = 0.86527$
$X_{As}^1 = 0.13400$ Temperature: About 770° C. to 764° C.
Growth thickness: About 0.46 μm After the crystal growth is completed, the crystal is rapidly cooled to room temperature.

The p+ type semiconductor region 14 is formed, for example, by selectively introducing cadmium (Cd) into the InGaAsP layer 13f. Moreover, the P type region 15 is formed, for example, by selectively ion implanting beryllium (Be) ions.

Now, in this embodiment, the ionization coefficient $\beta$ of the holes is larger than the ionization coefficient $\alpha$ of the electrons. Referring to FIG. 4, after the holes pass through the AlInAs layer 13c, which has the largest forbidden bandwidth, their ionization coefficient increases as they approach the p-n junction.

On the other hand, as the electrons generated by avalanche breakdown travel in a direction away from the p-n junction, when the electrons reach the largest forbidden bandwidth layer 13c, their ionization coefficient $\alpha$ falls, whereupon the ionization coefficient ratio $k=\beta/\alpha$ is enlarged. As a result, the multiplication noise is reduced.

Moreover, according to this invention, the dark current is caused by the "tunnel effect" is suppressed and a low dark current obtained because the p-n junction can be formed in a semiconductor layer with a relatively larger forbidden bandwidth.

The semiconductor device according to the embodiment has a light receiving wavelength band suitable for a wavelength of 1.65 μm. A dark current of several dozen nA is obtained under a reverse bias voltage of 90% of the avalanche breakdown voltage.

Moreover, since the multiplication noise has the ionization coefficient ratio as a parameter and $k \geq 10$, which is larger than the $k=2$ to 3 of the previous III-V group light receiving device, low noise characteristics are obtained.

As explained above, according to this invention, the ionization coefficient ratio of the carrier can be enlarged more than the inherent value of the semiconductor material. The multiplication noise, the most important factor behind APD noise, is reduced, and suppression of dark current is possible. Therefore, a light receiving semiconductor device can be obtained with superior characteristics, especially in the band of wavelength 1 μm or more, the main band of optical communications.

We claim:

1. A semiconductor device for receiving light, comprising:
   a first semiconductor layer having a first conductivity type and having a first forbidden bandwidth, electron-hole pairs being generated by said first semiconductor layer;
   a second semiconductor layer having the first conductivity type, formed on said first semiconductor layer, having a second forbidden bandwidth greater than said first forbidden bandwidth of said first semiconductor layer and distributed so that said second forbidden bandwidth has a maximum value at an intermediate position in the thickness direction of said second semiconductor layer; and
   a third semiconductor layer having a second conductivity type opposite the first conductivity type, formed on said second semiconductor layer, having a forbidden bandwidth smaller than that of the region between said third semiconductor layer and said second semiconductor layer and larger than that of said first semiconductor layer, said third semiconductor layer receiving the light incident thereon, holes being injected into the region between said second semiconductor layer, where said second forbidden bandwidth has a maximum value, and said third semiconductor layer so as to reduce multiplication noise.

2. A semiconductor device according to claim 1, wherein said first semiconductor layer comprises InGaAs and said second semiconductor layer comprises AlInAs such that the maximum value of said forbidden bandwidth is provided at the intermediate position of said second semiconductor layer.

3. A semiconductor device for receiving light, comprising:
   a first semiconductor layer of a first conductivity type and having a first forbidden bandwidth, electron-hole pairs being generated in said first semiconductor layer;
   a second semiconductor layer of the first conductivity type, formed on said first semiconductor layer, having a second forbidden bandwidth which is larger than that of said first forbidden bandwidth, a transition area being formed between said first and second semiconductor layers, said second forbidden bandwidth having a maximum value at an intermediate position in the thickness direction of said second semiconductor layer; and
   a third semiconductor layer of a second conductivity type opposite the first conductivity type, formed on said second semiconductor layer, forming a multiplication region between said second and third semiconductor layers, said third semiconductor layer receiving incident light, the forbidden bandwidth of the device gradually decreasing in a direction away from the maximum value of said forbidden bandwidth in said second semiconductor layer, the holes generated in said first semiconductor layer being injected into said multiplication region through the portion of said second semiconductor layer in which said second forbidden bandwidth has a maximum value so as to reduce multiplication noise.

4. A semiconductor device according to claim 3, wherein said first semiconductor layer comprises InGaAs and wherein said second semiconductor layer comprises AlInAs.

5. A semiconductor device according to claim 3, wherein said second semiconductor layer has a composition which varies such that said second forbidden bandwidth increases in the direction from the portion in which said second semiconductor layer contacts said first semiconductor layer toward the intermediate position in the thickness direction of said second semiconductor layer and decreases in the direction from the intermediate position of said second semiconductor layer to where said second semiconductor layer contacts said third semiconductor layer.

6. A semiconductor device according to claim 3, wherein said second semiconductor layer comprises a plurality of laminated layers in which the composition of said plurality of laminated layers varies in a stepwise fashion, such that said second forbidden bandwidth increases stepwise in a direction from said first semiconductor layer toward the intermediate position in the thickness direction of said second semiconductor device, where said second forbidden bandwidth is at a maximum, and decreases stepwise in a direction toward said third semiconductor substrate.

* * * * *

UNITED STATES PATENT AND TRADEMARK OFFICE
CERTIFICATE OF CORRECTION

PATENT NO. : 4,701,773
DATED : OCTOBER 20, 1987
INVENTOR(S) : TAKAO KANEDA ET AL.

It is certified that error appears in the above-identified patent and that said Letters Patent is hereby corrected as shown below:

FRONT PAGE [57] ABSTRACT, line 3, "type; the" should be
--type. The--;
line 15, after "the" (first occurrence) insert
--third--.

Col. 1, line 38, delete "APD's";
line 39, delete "for".

Col. 2, line 22, delete "the" (first occurrence);
line 42, "in" should be --into--.

Col. 3, line 1, "a" (first occurrence) should be --the--;
line 64, after "layer" insert --.--.

Col. 4, line 21, "layers" should be --layer--;
line 26, "in to" should be --into--.

Col. 5, line 11, "solution" should be --Solution--.

Signed and Sealed this

Twenty-ninth Day of March, 1988

Attest:

DONALD J. QUIGG

*Attesting Officer*         *Commissioner of Patents and Trademarks*